United States Patent [19]

Davies et al.

[11] Patent Number: 5,087,840
[45] Date of Patent: Feb. 11, 1992

[54] INTEGRATED OUTPUT BUFFER LOGIC CIRCUIT WITH A MEMORY CIRCUIT

[75] Inventors: Thomas J. Davies, Eindhoven, Netherlands; Leonardus C. M. G. Pfennings, decease, late of Sittard; by Henricus J. Kunnen, legal representative, Valkenswaar, both of Netherlands; Peter H. Voss; Cormac M. O'Connell; Cathal G. Phelan; Hans Ontrop, all of Eindhoven, Netherlands

[73] Assignee: U.S. Philips Corp., New York, N.Y.

[21] Appl. No.: 657,334

[22] Filed: Feb. 13, 1991

Related U.S. Application Data

[63] Continuation of Ser. No. 332,861, Apr. 3, 1989, abandoned.

[30] Foreign Application Priority Data

Apr. 6, 1989 [NL] Netherlands .............................. 880872

[51] Int. Cl.$^5$ .................. H03K 19/0175; H03K 19/00
[52] U.S. Cl. .................................... 307/475; 307/473; 307/247.1; 307/480
[58] Field of Search ............... 307/443, 473, 475, 480, 307/481, 269, 445, 247.1; 328/63, 72, 110, 120

[56] References Cited

U.S. PATENT DOCUMENTS

| | | | |
|---|---|---|---|
| 3,924,193 | 12/1975 | Wolff | 307/247.1 |
| 3,942,042 | 3/1976 | Nikami | 307/247.1 |
| 3,947,697 | 3/1976 | Archer et al. | 307/247.1 |
| 4,480,198 | 10/1984 | Gass | 307/219 |
| 4,525,635 | 6/1985 | Gillberg | 307/480 |
| 4,527,277 | 7/1985 | Kosaka et al. | 328/133 |
| 4,568,881 | 2/1986 | Kostrov | 307/479 |
| 4,692,635 | 9/1987 | Rapp | 307/481 |
| 4,926,451 | 5/1990 | Yoshihara et al. | 307/479 |

*Primary Examiner*—Timothy P. Callahan
*Attorney, Agent, or Firm*—Steven R. Biren

[57] ABSTRACT

An integrated circuit having logic circuits and a logic output buffer, which circuit includes the following subcircuits: a memory circuit and a logic output circuit, in which no tri-state occurs at the output during a sequence of data signals at the input, wherein the drive of the circuit by means of control signals is not critical over time because the first data signal from the sequence switches off the tri-state mode, the tri-state mode again being introduced if a control signal is furnished, and in the absence of this control signal, the last data signal is retained.

10 Claims, 3 Drawing Sheets

INTEGRATED OUTPUT BUFFER LOGIC CIRCUIT WITH A MEMORY CIRCUIT

This is a continuation of application Ser. No. 332,861, filed Apr. 3, 1989, now abandoned.

BACKGROUND OF THE INVENTION

The invention relates to an integrated circuit comprising a function section which generates logic data signals, a memory circuit fed therewith, and, connected to an output of the memory circuit, a logic output circuit for receiving an output signal from the memory circuit and transmitting this output signal, characterized in that the input and output of the memory circuit are separated, and in that the logic output circuit comprises a second input, connected in parallel to the input of the memory circuit while bypassing same, so as to bring the logic output circuit and the memory circuit direct into a logic state determined by a data signal originating from the function section, subsequent to which this logic output circuit is retained in this logic state by the output signal of the memory circuit.

A circuit of the general type mentioned above is known from IEEE Journal of Solid-State Circuits, Vol. SC-21, No. 5, October 1986: Flannagan et al., "Two 13-ns 64K CMOS SRAM's with very low active power and improved asynchronous circuit techniques", more specifically, FIG. 11. The memory circuit therein comprises a LATCH element having inputs and outputs connected to one another, and the logic output circuit comprises a plurality of inverting elements and three output transistors.

In the referenced paper the LATCH element is used for taking over the respective signals DATA and $\overline{\text{DATA}}$ during a logic-low control signal $\overline{\text{STABLE}}$, so as to apply these signals with low output-impedances to the logic output circuit to diminish disturbing effects, for example caused by cross-talk from adjacent signal-conducting lines or caused by disturbances in the supplied power. Before new respective signals DATA and $\overline{\text{DATA}}$ are applied to the output buffer in a sequence of signals, input lines are latched to a logic-low level by means of transistors and a logic-high $\overline{\text{STABLE}}$ control signal, so that the LATCH element will not take over any faulty signal information and retain this information afterwards in the process of the development of the DATA and $\overline{\text{DATA}}$ signals as a function of time in a memory section not described in this paper. For this purpose, an exact tuning of the $\overline{\text{STABLE}}$ and CYC-END signals is required, because otherwise the LATCH element would be switched on at a logic-high $\overline{\text{STABLE}}$ control signal, as a result of which one of the input lines would be pulled up to a logic-high level. Such a situation causes undesirable dissipation. A greater certainty that the above will not occur is obtained by not allowing $\overline{\text{STABLE}}$ and CYC-END to overlap, but which will cause a delay. Thus, accurate tuning as a function of time is required between the $\overline{\text{STABLE}}$ monitoring signal and the CYC-END control signal. Owing to the blocking of the transistors M14, M15 and M16 during logic-low latched input lines for the duration of the signal transitions of the DATA and $\overline{\text{DATA}}$ signals at the beginning of a new read period (while CYC-END and $\overline{\text{STABLE}}$ are logic-high), the output DATA OUT is in a tri-state mode. With a supply voltage of approximately 5 volts, the voltage at the output of the logic output buffer will reach a value of approximately 1.7 volts when loaded by a Transistor-Transistor Logic (TTL) circuit (the load resistance to the first supply terminal being approximately twice as large as that to the second supply terminal) for the duration of the blocking state of the transistors M14, M15 and M16. This implies that the voltage at the output of the logic output buffer, with DATA and $\overline{\text{DATA}}$ signals remaining constant between the successive read periods, does not remain logic-high or logic-low, but is set to a level of approximately 1.7 volts despite the tri-state mode of the output buffer. These level variations are undesired since they form a source of possible cross-talk to any adjacent signal lines in an integrated circuit.

SUMMARY OF THE INVENTION

It is an object of the invention to provide an integrated circuit wherein the output circuit is not tri-stated during a sequence of data signals that originate from the function section, wherein the control or monitoring signals that originate from the function section are not critical over time, and wherein the memory circuit and the logic output circuit nevertheless show a fast switching behavior.

For this purpose an integrated circuit according to the invention is characterized in that the input and output of the memory circuit are separated, and in that the logic output circuit comprises a second input, connected in parallel with the input of the memory circuit while bypassing same, so as to bring the logic output circuit and the memory circuit direct into a logic state determined by a data signal originating from the function section, subsequent to which this output circuit is retained in this logic state by the output signal of the memory circuit. Such an integrated circuit is advantageous in that the output of the memory circuit is always determined by the input of the memory circuit, so that control or monitoring signals are not required for the operation of the memory circuit. Consequently, the output of the logic output buffer need not be brought into a tri-state mode for every new data input signal. Becuase a tri-stated output is avoided during the transfer of new data signals in the logic output circuit, the output will hence always be defined. Consequently, no unnecessary charging or discharge currents will occur, so that it will be impossible for cross-talk to occur to any adjacent signal-conveying lines. Furthermore, with a capacitive load connected to the output, a time delay due to unnecessary charging or discharging thereof will be avoided. Due to the absence of control or monitoring signals determined critically relative to one another as a function of time, a maximum speed of the circuit can be achieved. In addition, the parallel link to the input of the memory circuit entails a faster switching behavior of the integrated circuit, because the parallel link avoids the inherent time delay of the cascaded memory element for accepting the signals applied.

An embodiment of an integrated circuit according to the invention is characterized in that the input and the output of the memory circuit are connected to the remaining section of the logic output circuit via a logic sub-circuit with a symmetrical logic function, which forms part of the logic output circuit. In effect, the logic output circuit responds both directly to data signals orginating from the function section and to the signal on the output of the memory circuit, which signal on the output of the memory circuit, in response to the data signals, will be available after the inherent time delay of the memory circuit.

A further embodiment of an integrated circuit according to the invention is characterized in that the memory circuit comprises at least a single flip-flop circuit, in that the logic sub-circuit comprises at least a first and a second logic gate which perform an OR-function, in that the inverted output ($\overline{Q}$) and the first input of the flip-flop circuit are connected each to an input and a further input of the second logic gate and in that the non-inverted output (Q) and the second input of the flip-flop circuit are connected each to an input and a further input of the first logic gate. The coupling of input and output signals of the flip-flop circuit is effected by, for example, logic OR-gates or NAND-gates (then receiving inverted input signals).

A preferred embodiment of an integrated circuit according to the invention is characterized in that the memory circuit comprises a further flip-flop circuit, of which a first input is coupled to data input terminals via logic gates, a second input is connected to a monitoring input terminal and an output is connected to a third logic gate having a logic OR-function in the logic sub-circuit, whereas a further input of the third logic gate is connected to the second input of the further flip-flop circuit. The further flip-flop circuit is used for storing a monitoring signal indicating whether the output of the output buffer is to be tri-statable or not tri-statable. The transition to a tri-state mode is determined direct and only by a monitoring signal of a specific logic level. Leaving a tri-state mode, however, is realized by means of a signal derived from the signals at the data input terminals at the occurrence of the other logic level of the monitoring signal. Consequently, there is no need at all for the extra monitoring signal to be determined very accurately over time.

BRIEF DESCRIPTION OF THE DRAWING

The invention will now be further explained with reference to the embodiments represented in the drawing, in which.

DESCRIPTION OF THE PREFERRED EMBODIMENTS

Figure 1:
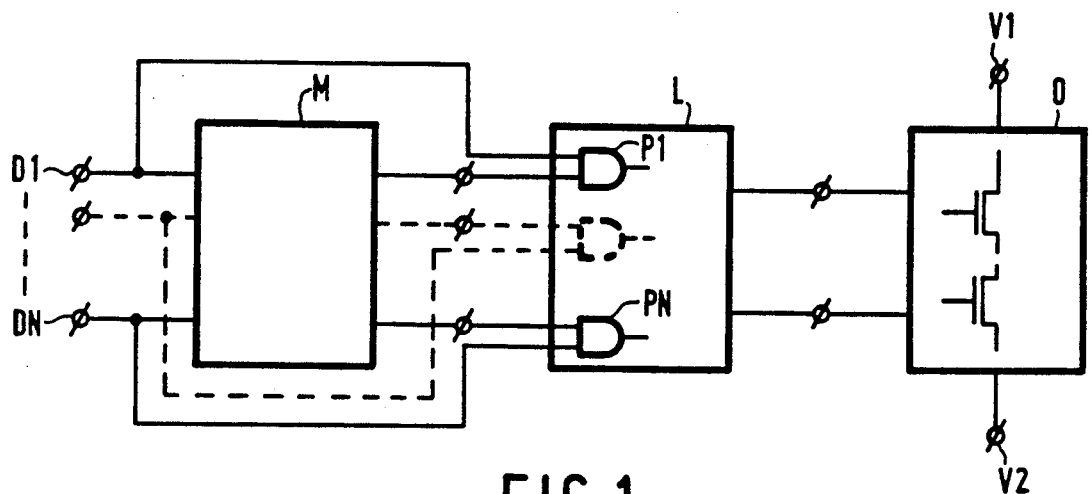
FIG. 1 shows a logic output buffer in accordance with the invention.

FIG. 1 shows a logic output buffer in accordance with the invention. The output buffer receives N input signals D1 to DN and comprises a memory circuit M, a logic sub-circuit L and a logic output stage O. The memory circuit M has at least two input and at least two output terminals. The logic sub-circuit L has at least two logic gates whose inputs are connected each to an input terminal and an output terminal of the memory circuit M. The output stage O, which comprises at least two output transistors, is connected to two output terminals of the logic sub-circuit L.

In the further description, the signals that are logic-low or logic-high respectively, will be referred to as "low" or "high" respectively, and an n-channel field effect transistor or a bipolar npn-transistor and a p-channel field effect transistor or a bipolar pnp-transistor as an n-type transistor or p-type transistor respectively.

The operation of the output buffer in FIG. 1 is as follows:

The memory circuit M receives N logic signals D1 to DN at the input terminals, which signals are stored in the memory circuit M and likewise transferred via parallel links to the logic sub-circuit L. The output signals of the memory circuit M are transferred to the logic sub-circuit L. Memory circuit M is used for storing logic levels (for example logic-high) of the signals D1 to DN, so that any brief logic active levels of the signals D1 to DN are retained. Memory circuit M comprises an inherent time delay for taking over and transferring logic active levels of the signals D1 to DN, so that after being delayed, logic changes on the input terminals of the memory circuit M will be transferred to the output terminals. As a result of the direct parallel links for the signals D1 to DN to the logic sub-circuit L, changes in these signals will also be transferred to the logic sub-circuit L without being delayed, however. The logic gates P1 to PN transfer the signals D1 to DN as well as the output signals of memory circuit M to any further logic in sub-circuit L. The output signals of sub-circuit L control the logic output stage O, which can furnish a "high", "low" or tri-state level, to which terminal a load can be applied.

Figure 2:
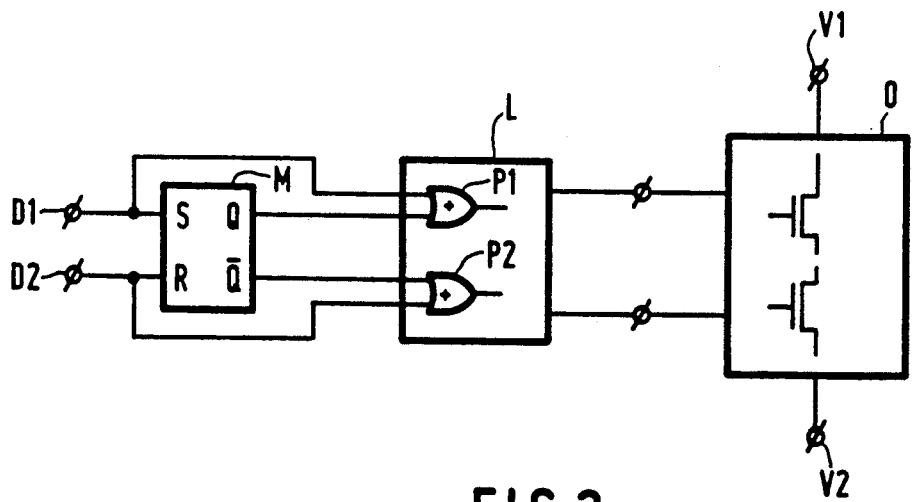
FIG. 2 shows an embodiment of a logic output buffer according to the invention.

An embodiment of a logic output buffer according to the invention which is shown in FIG. 2 corresponds to that of FIG. 1 so that the same reference characters are used for designating the same components. Memory circuit M comprises a Set-Reset (SR) flip-flop circuit with an inverted ($\overline{Q}$) and a non-inverted (Q) output, the Set and Reset input respectively, of the flip-flop circuit receiving the signals D1 and D2 respectively. The logic sub-circuit L comprises two OR-gates P1 and P2.

The operation of the logic output buffer in FIG. 2 is as follows:

Signals D1 and D2 are active signals when they are "high", that is to say, when D1 is "high" and D2 is "low" or D1 is "low" and D2 is "high" the output terminal of the output stage is to be "high" or "low" respectively, or "low" or "high" respectively, and when D1 and D2 are "low", the level at the output terminal is to remain unchanged. The simultaneous occurrence of a "high" signal D1 and D2 is to be avoided, as it does not have any logic meaning and is improper for a correct operation of the Set-Reset flip-flop circuit. When there is a "high" signal D1 (D2 is "low" in that case) the Set-Reset flip-flop circuit is set. This setting will be effected after a certain delay time so that only after a specific delay time the output Q or $\overline{Q}$ respectively, will be "high" or "low". Because a "high" signal D1 is applied direct to OR-gate P1, it will receive a high signal D1 undelayed and its output will transfer a "high" signal to each further logic in the logic sub-circuit L. After the said setting delay of the flip-flop circuit the output Q or $\overline{Q}$ respectively, will become "high" or "low" respectively, and the output of OR-gate P1 "high", which will then no longer depend on the logic value of signal D1. This implies that the Set-Reset flip-flop circuit has taken over a "high" level from signal D1 and the logic sub-circuit L will be continued to be driven by the flip-flop circuit. When there is a high signal D2 the Set-Reset flip-flop circuit will be reset. This resetting will also be realized only after a certain delay time has elapsed so that the inverted output $\overline{Q}$ signal or the non-inverted output Q signal respectively, will be "high" or "low" respectively, after a delay relative to the Reset input (R) signal. Owing to the fact a "high" signal D2 is applied direct to OR-gate P2, it will receive a "high" signal D2 undelayed and its output will transfer a "high" signal to each additional logic in the logic sub-circuit L. After the above delay of the flip-flop circuits the output $\overline{Q}$ or Q respectively, will become "high" or "low" respectively and OR-gate P2 likewise continue to supply a high output signal, irrespective of the logic value of signal D2. This implies that the circuit L is kept in a stationary condition by the flip-flop circuit.

Figure 3:
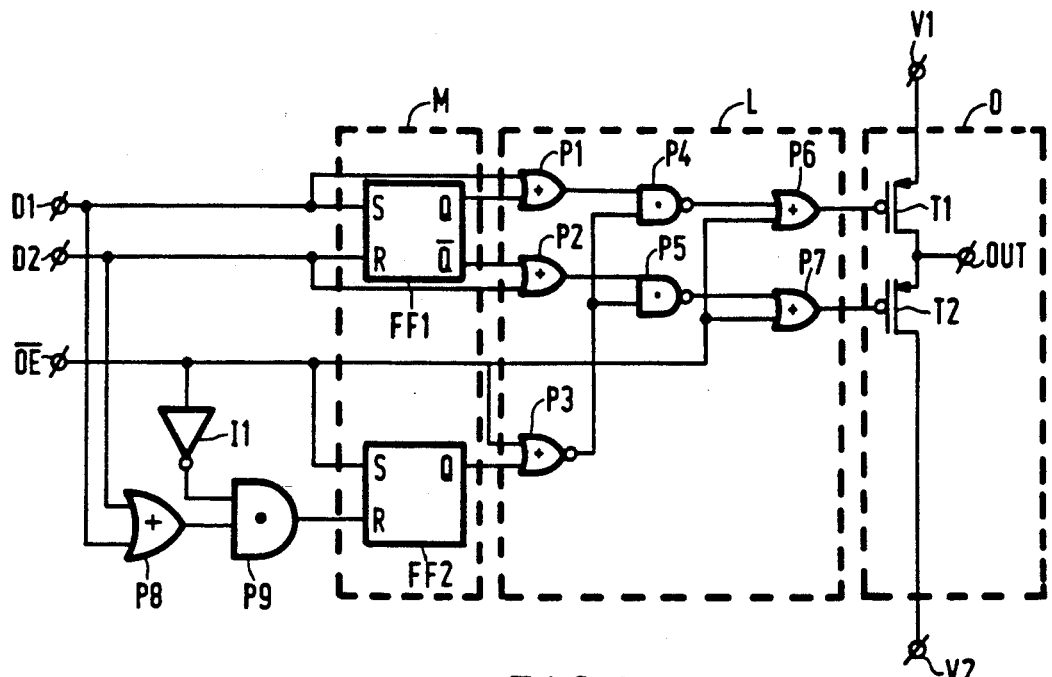
FIG. 3 shows a preferred embodiment of a logic output buffer according to the invention.

A preferred embodiment of a logic output buffer according to the invention which is shown in FIG. 3, also corresponds with the one shown in FIG. 1, so that the same reference symbols are used for designating the same components, while the memory circuit M comprises a first and a second Set-Reset flip-flop circuit FF1, FF2 respectively, the logic sub-circuit L includes four OR-gates P1, P2, P6 and P7, a single NOR-gate P3 and two NAND-gates P4 and P5, the output stage O includes two PMOS-transistors T1 and T2 and the output buffer has three input terminals at which the respective input signals D1, D2 and $\overline{OE}$ are present. Between the output-buffer input to which the input signals D1, D2 and $\overline{OE}$ are applied and the Reset (R) input of the second flip-flop circuit FF2 there are inserted an OR-gate P8, an AND-gate P9 and an inverting element I1. The respective input signals D1 and D2 are applied to the Set and Reset inputs (S and R respectively) of the first flip-flop circuit FF1 and the respective first and second inputs of OR-gates P1 and P2. The non-inverted output Q and inverted output $\overline{Q}$ of the first flip-flop circuit FF1 are connected to the respective second and first inputs of OR-gates P1 and P2. The respective first and second output-buffer input terminals are likewise coupled to the respective first and second input terminals of OR-gate P8, whose output is connected to a second input terminal of AND-gate P9. The third output-buffer input terminal to which the monitoring signal $\overline{OE}$ is applied is coupled to the input terminal of inverting element I1, the Set input (S) of the second flip-flop circuit FF2, the first input terminal of NOR-gate P3, the second input terminal of OR-gate P6 and the second input terminal of OR-gate P7, in that order. The output of inverting element I1 is connected to a first input terminal of AND-gate P9, whose output is coupled to the Reset input (R) of the second flip-flop circuit FF2. The non-inverted output Q of flip-flop circuit FF2 is connected to the second input terminal of NOR-gate P3, whose output is coupled to the second input terminal of NOR-gates P4 and P5. From the point of view of logical operations, the function of NOR-gate P3 is the same as that of a cascade arrangement of an OR-gate and an inverting element. The respective outputs of OR-gates P1 and P2 are connected to the respective first input terminals of NAND-gates P4 and P5. The respective outputs of NAND-gates P4 and P5 are connected to the respective first input terminals of OR-gates P6 and P7. The respective outputs of OR-gates P6 and P7 are coupled to the respective gate electrodes of transistors T1 and T2. The source and the drain of transistor T1 are connected to the first supply terminal V1 and an output terminal OUT and the source and the drain of transistor T2 are connected to the output terminal OUT and second supply terminal V2, in that order.

The operation of the output buffer in FIG. 3 is as follows:

Signals D1 and D2 are active signals when they are "high", as has already been explained with respect to the circuit operation of FIG. 2. The third input signal $\overline{OE}$, which is also an active signal when it is high, performs a monitoring function and indicates whether the output buffer is to be tri-state ($\overline{OE}$ is then "high") or not tri-state ($\overline{OE}$ is then "low"). The operation of the circuit will be further discussed for a respective "low" and "high" input signal $\overline{OE}$.

When there is a "low" input signal $\overline{OE}$ the second input terminals of OR-gate P6 and P7 receive a "low" signal. When there is a "low" signal D2 and when signal D1 changes from "low" to "high", the first input terminal of gate P1 will receive a "high" signal, the output of OR-gate P1 become "high" and the first flip-flop circuit FF1 will be set. After a setting delay of the first flip-flop circuit FF1, the respective non-inverted output Q and inverted output $\overline{Q}$ will be "high" and "low" and the flip-flop circuit FF1 will have taken over the information on input terminals D1 and D2. The outputs of the respective OR-gates P1 and P2 consequently continue to be "high" and "low" respectively. The output of OR-gate P8 will be "high" as a result of a "high" signal on its second input terminal, as will the output of inverting element I1, so that the output of AND-gate P9 will also be "high". Consequently, the second flip-flop circuit FF2 will be reset, as a result of which, after a resetting delay of flip-flop circuit FF2, output Q will become "low" in the case when the output Q was "high" prior to the reset, or remain "low" in the case when the output Q was already "low" prior to the reset. This causes the output of NOR-gate P3 to become "high", so that the outputs of the respective NAND-gates P4 and P5 become "low" and "high" respectively. Consequently, the outputs of the OR-gates P6 and P7 will become "low" and "high" respectively, causing the respective transistors T1 and T2 to conduct or block and the output terminal OUT to be "high". When the signal on input terminal D1 changes from "high" to "low" and when the signal on input terminal D2 remains "low", output terminal OUT will remain "high" as a result of the memory function of the first flip-flop circuit FF1.

When the signals $\overline{OE}$ and D1 are low, but when the signal D2 changes from "low" to "high", the output of OR gate P1 will remain "high" temporarily, and the output of OR-gate P2 will become "high". Flip-flop circuit FF1 will be reset, causing the respective outputs Q and $\overline{Q}$ to become "low" and "high" after a certain resetting delay and, subsequently, the output of OR-gate P1 to become "low" and the output of OR-gate P2 to remain "high". As a result of a "high" output of both OR-gate P8 and inverting element I1, the output of AND-gate P9 will become "high" and flip-flop circuit FF2 be or remain reset, causing the output buffer to leave a possible tri-state mode. The output of NOR-gate P3 becomes or remains "high" causing the respective outputs of NAND-gates P4 and P5 to become "high" and "low". The outputs of respective OR-gates P6 and P7 will consequently become "high" and "low", causing the respective transistors T1 and T2 to block and be conductive and the output terminal OUT to be "low". When the signal on input terminal D2 is changed, the output terminal OUT will remain "low" as a result of the memory function of the first flip-flop circuit FF1.

When the signal on input terminal $\overline{OE}$ changes from "low" to "high", the flip-flop circuit FF2 will be set.

The second inputs of OR-gates P6 and P7 will receive direct a "high" signal causing the outputs P6 and P7 to become "high" and the transistors T1 and T2 to block (tri-state). After a setting delay time of the second flip-flop circuit FF2 the output Q of flip-flop circuit FF2 will become "high" and the output of NOR-gate P3 "low". This will cause the outputs of NAND-gates P4 and P5 to become "high", so that the outputs of OR-gates P6 and P7 will remain "high". Transistors T1 and T2 will continue to block (tri-state) as a result of the memory function of flip-flop circuit FF2. As indicated hereinbefore, the output of the output buffer will be taken from the tri-state mode to a respective logic high or logic low state when a "high" logic active signal D1 or D2 occurs.

Each of the Set-Reset flip-flop circuits FF1 and FF2 represented in FIG. 3 can be constituted by, for example, two feedback inverting elements. It will be evident to those skilled in the art that the memory circuit M can also be realized with memory elements different from Set-Reset flip-flop circuits. The Set-Reset flip-flop circuits can be replaced by, for example, JK-flip-flop circuits, without this requiring a change in the structure of the logic output buffer circuit. The couplings of the Set and Reset inputs of the second flip-flop circuit FF2 can be exchanged without complications, gate P3 then requiring connection to the inverted output $\bar{Q}$ instead of the non-inverted output Q. It will be evident that the said PMOS transistors in the output stage O merely serve as an example. Basically, the output stage can be formed by a cascade arrangement of two arbitrary transistors (both bipolar and unipolar), in which case the conductivity type of the transistors used should certainly be considered in connection with the required drive of the gate electrode of the transistor concerned for making this transistor conduct or block.

Figure 4:
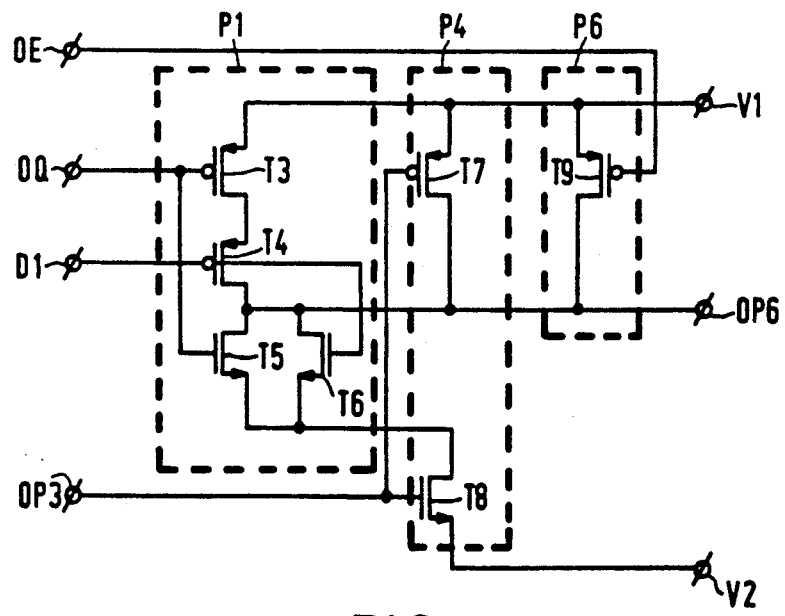
FIG. 4 shows in detail a portion of the logic output buffer shown in FIG. 3.

In FIG. 4 is represented in detail an equivalent implementation of a section of the logic output buffer from FIG. 3 so that the same reference symbols are used for designating the same components, that is to say, gates P1, P4 and P6. The gate P1 comprises two PMOS transistors T3 and T4 respectively, and two NMOS transistors T5 and T6 respectively. The gate P4 comprises a PMOS transistor T7 and an NMOS transistor T8 and finally, gate P6 comprises a PMOS transistor T9. The circuit represented in FIG. 4 receives four input signals, that is to say, signal OE, which is the inverted version of signal $\overline{OE}$ and is available at the output of inverting element I1 (see FIG. 3), signal OQ, originating from the output Q of the first flip-flop circuit FF1, input signal D1, and a signal OP3, originating from the output of gate P3 (see FIG. 3). The circuit output signal OP6 is applied to the gate electrode of transistor T1. The sources of transistors T3, T7 and T9 are interconnected and connected to a first supply terminal V1. The drains of the transistors T4, T5, T6, T7 and T9 are interconnected and connected to the output terminal of the circuit, and the sources of transistors T5 and T6 are interconnected and connected to the drain of transistor T8. The source of transistor T8 is connected to the second supply terminal V2, while the drain of transistor T3 is connected to the source of transistor T4. The input signal OE is coupled to the gate of transistor T9, while the respective input signals OQ and D1 are applied to the gate electrodes of respective transistors T3, T5 and T4, T6. Finally, the input signal OP3 is applied to the gate electrode of transistor T8.

The circuit operation in FIG. 4 is as follows: When transistor T9 is conducting, OP6 is "high", which is also the case when the transistors T5, T6 and T8 do not form a conductive path between the circuit output terminal and the second supply terminal V2. The signal OP6 is constituted by the signals OE, OQ, D1 and OP3 with the aid of binary logic in the following manner:

$$OP6 = \overline{OQ+D1} + \overline{OP3} + \overline{OE}$$

For signal OP6 this result corresponds to the operations carried out by the gates P1, P4 and P6. As shown in the Figure the realization of the gates P1, P4 and P6 requires no more than 7 transistors. This number is considerably smaller than would be required for realizing the above-shown gate elements with standard logic gates, where 6 transistors (4 transistors for a NOR-gate plus 2 transistors for an inverting element) are used for realizing an OR-gate, and 4 transistors are used for realizing a NOR-gate. For two OR-gates and a single NOR-gate a total of 16 transistors would be required.

The gates P2, P5 and P7 can be realized in a way similar to that for realizing gates P1, P4 and P6 as is represented in FIG. 4, since these gates carry out the same logic operations as the gates P1, P4 and P6. The above realization of the gates P2, P5 and P7 thus also requires no more than 7 transistors. The gates P1, P4, P6 and P2, P5, P7 also have a smaller switching delay than three standard logic gate elements.

Figure 5:
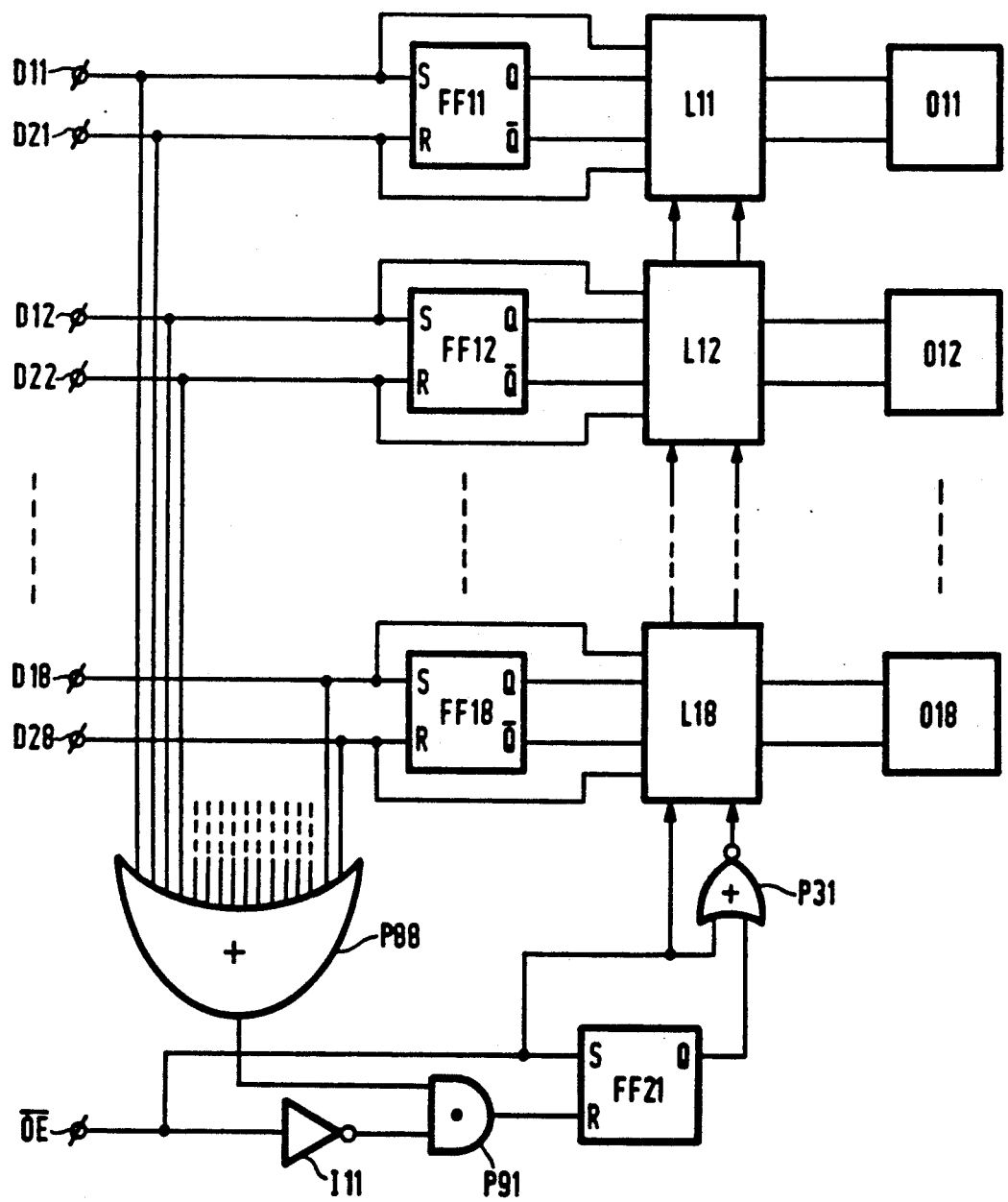
FIG. 5 shows a different embodiment of a logic output buffer according to the invention.

FIG. 5 shows an embodiment of a logic circuit and a plurality of parallel logic output buffers according to the invention. The embodiment of FIG. 5 comprises 8 Set-Reset flip-flop circuits FF11 to FF18 operating in parallel, 1 Set-Reset flip-flop circuit FF21, 8 parallel logic sub-circuits L11 to L18, 8 parallel logic output stages O11 to O18, an OR-gate P88 having 16 input terminals, an inverting element I11, and AND-gate P91 and a NOR-gate P31. The logic sub-circuits L11 to L18 each comprise the logic gates P1, P2, P4, P5, P6 and P7 (as represented in FIG. 3), which are interconnected in the same way as shown in FIG. 3. The logic output stages O11 to O18 are each equal to the logic output stage O as described with respect to FIG. 3. The couplings between Set-Reset flip-flop circuits FF11 to FF18 respectively, and logic sub-circuit L11 to L18 respectively, and between logic sub-circuit L11 to L18 respectively, and logic output stage O11 to O18 respectively, are the same as shown in FIG. 3. Input signals D11 and D21 to D18 and D28 respectively, are applied to the flip-flop circuits FF11 to FF18 respectively, and are applied each to separate inputs of OR-gate P88. The output of OR-gate P88 is connected to a first input terminal of AND-gate P91, while a monitoring signal $\overline{OE}$ is applied to a second input terminal of AND-gate P91 via the inverting element I11. The respective monitoring signal $\overline{OE}$ and output signal of AND-gate P91 are applied to the respective Set and Reset inputs of flip-flop circuit FF21, whereas the respective monitoring signal $\overline{OE}$ and non-inverted output signal Q of flip-flop circuit FF21 are applied to a respective first and second input terminal of NOR-gate P31. The monitoring signal $\overline{OE}$ and the output signal of NOR-gate P31 are applied to each of the logic sub-circuits L11 to L18 in the same way as described with reference to FIG. 3.

The operation of the logic circuit in FIG. 5 is virtually equal to the operation of the circuit represented in FIG. 3 (so that also parts of the description of the circuit operation of FIG. 3 may be referred to). The logic circuit in FIG. 5 has 8 parallel paths for storing and possibly transferring input data to the 8 outputs according to the principle as is represented in the description of FIG. 3. However, the logic circuit in FIG. 5 requires only a single flip-flop circuit FF21 and three logic gates I11, P31 and P91 for storing and processing a monitoring signal $\overline{OE}$, which monitoring signal and processed signal are simultaneously applied to all 8 logic sub-circuits L11, L12, ..., L18. The input signals D11 and D21 to D18 and D28 (the input signals through a parallel path being preferably not delayed relative to the input signals through another parallel path) are applied each to the input of an OR-gate P88, so that when at least one of the aforementioned input signals is "high", a possible tri-state mode of all output stages is cancelled for all output stages. This implies that the logic sub-circuits L11 to L18 do not all need a flip-flop circuit FF21 and a number of logic gates (I11, P31 and P91) for controlling the output stage O11 to O18 respectively, but only a single monitoring circuit is required, which yields a saving on the number of components required. It will be evident to those skilled in the art that the aforesaid quantity of 8 parallel data paths merely serves as an example and that this number, considered in the framework of the invention, may be arbitrary.

What is claimed is:

1. An integrated circuit comprising a memory circuit for receiving logic data signals and a logic output circuit connected to a memory circuit output for receiving an output signal from the memory circuit and for transmitting this output signal, wherein the logic output circuit comprises a second input, connected in parallel with the input of the memory circuit, for bringing the logic output circuit and the memory circuit directly and in substantially undelayed fashion into a logic state determined by a received data signal, said output circuit being maintained in said logic state by the output signal of the memory circuit, the input and the output of the memory circuit being connected to a logic sub-circuit with a symmetrical logic function, which sub-circuit forms part of the logic output circuit, the memory circuit comprising at least a single flip-flop circuit having two inputs, the logic sub-circuit comprising at least first and second logic gates which perform an OR function, the inverted output ($\overline{Q}$) and the first input of the flip-flop circuit being connected, respectively, to an input and a further input of the second logic gate, and the non-inverted output (Q) and the second input of the flip-flop circuit being connected, respectively, to an input and a further input of the first logic gate.

2. An integrated circuit as claimed in claim 1, characterized in that the memory circuit comprises a further flip-flop circuit, of which a first input is coupled to said logic data signals via logic gates, a second input is connected to a monitoring input terminal and an output is connected to a third logic gate having a logic OR-function in the logic sub-circuit, and a further input of the third logic gate is connected to the second input of the further flip-flop circuit.

3. An integrated circuit as claimed in claim 1, characterized in that the integrated circuit comprises a plurality of logic output buffers and in that a further flip-flop circuit is provided, of which a first output is coupled to said logic data signals via logic gates, a second input is connected to a monitoring input terminal and an output is connected to a third gate performing a logic OR function in the logic sub-circuit, and a further input of the third logic gate is connected to the second input of the further flip-flop circuit.

4. An integrated circuit as claimed in claim 1, characterized in that the said flip-flop circuits are of the Set-Reset type (SR) and in that a first and a second input, respectively, is the reset or set input, respectively, of a Set-Reset (SR) flip-flop circuit.

5. An integrated circuit as claimed in claim 2, characterized in that all logic data signals are coupled to the reset input of the further flip-flop circuit via a fourth gate performing a logic OR function.

6. An integrated circuit as claimed in claim 5, characterized in that the monitoring input terminal is coupled, via a first inverting element and the output of the fourth OR-gate respectively, to a first and a second input terminal, respectively, of a first AND-gate whose output is connected to the reset input of the further flip-flop circuit.

7. An integrated circuit as claimed in claim 6, characterized in that the fourth logic gate comprises parallel-arranged n-type transistors whose individual gate electrodes are each connected to one of the logic data signals and the first AND-gate comprises a single n-type transistor whose gate electrode is connected to the output of the first inverting element, the sources of the parallel-arranged transistors are coupled to the drain of the single transistor, the source of the single transistor is coupled to the second supply terminal, and the drains of the parallel-arranged transistors are coupled to the output of the further flip-flop circuit.

8. An integrated circuit as claimed in claim 6, characterized in that the logic sub-circuit further includes a first and a second NAND-gate, a fifth and a sixth OR-gate and a second inverting element, the output of the third OR-gate being coupled to a second input terminal of the first and second NAND-gates via the second inverting element, and the respective outputs of the first and second OR-gates are connected to the respective first input terminals of the first and second NAND-gates, whose output terminals are connected to the first input terminals of the respective fifth and sixth OR-gates, whose second input terminals are connected to the monitoring input terminal.

9. An integrated circuit as claimed in claim 8, characterized in that the first OR-gate comprises a first and a second p-type and a first and a second n-type transistor, the first NAND-gate comprises a third p-type and a third n-type transistor and the fifth OR-gate comprises a fourth p-type transistor, the sources of the first, third and fourth p-type transistors are interconnected and connected to the first supply terminal, the drains of the second, third and fourth p-type transistors as well as the first and second n-type transistors are interconnected and constitute the output of the fifth OR-gate, the source electrodes of the first and second n-type transistors are connected to one another and to the drain of the third n-type transistor, whose source is connected to the second supply terminal, whereas the drain of the first p-type transistor is connected to the source of the second p-type transistor, the non-inverted output of the first flip-flop circuit is connected to the gates of the first p-type and first n-type transistors, the output of the first inverting element is connected to the gate electrode of the fourth p-type transistor, the first data input terminal is connected to the gate electrodes of the second p-type and second n-type transistors, and the output of the third OR-gate is connected to the gate electrodes of the third p-type and third n-type transistors.

10. An integrated circuit as claimed in claim 9, characterized in that each said n-type transistor is one of an n-channel field-effect transistor and a bipolar npn transistor and each said p-type transistor is one of a p-channel field-effect transistor and a bipolar pnp transistor.

* * * * *